United States Patent
Coker et al.

(10) Patent No.: US 7,303,972 B2
(45) Date of Patent: Dec. 4, 2007

(54) INTEGRATED THIN-FILM RESISTOR WITH DIRECT CONTACT

(75) Inventors: Eric M. Coker, Burlington, VT (US); Douglas D. Coolbaugh, Essex Junction, VT (US); Ebenezer E. Eshun, Essex Junction, VT (US); Zhong-Xiang He, Essex Junction, VT (US); Matthew D. Moon, Jeffersonville, VT (US); Anthony K. Stamper, Williston, VT (US)

(73) Assignee: International Business Machines Incorporated, Armonk, NY (US)

( * ) Notice: Subject to any disclaimer, the term of this patent is extended or adjusted under 35 U.S.C. 154(b) by 67 days.

(21) Appl. No.: 11/275,611

(22) Filed: Jan. 19, 2006

(65) Prior Publication Data

US 2007/0166909 A1 Jul. 19, 2007

(51) Int. Cl.
*H01L 21/20* (2006.01)
(52) U.S. Cl. .............................. 438/384; 257/E21.004
(58) Field of Classification Search ........ 438/382–385; 257/E21.004
See application file for complete search history.

(56) References Cited

U.S. PATENT DOCUMENTS

| | | | | |
|---|---|---|---|---|
| 4,208,781 A | * | 6/1980 | Rao et al. | 438/238 |
| 4,592,128 A | * | 6/1986 | Bourassa | 438/238 |
| 6,607,962 B2 | | 8/2003 | Zekeriya | |
| 6,703,666 B1 | | 3/2004 | Huttemann | |
| 2004/0130434 A1 | | 7/2004 | Chinthakindi | |

* cited by examiner

*Primary Examiner*—Richard A. Booth
(74) *Attorney, Agent, or Firm*—Anthony J. Canale

(57) ABSTRACT

A BEOL thin-film resistor adapted for flexible integration rests on a first layer of ILD. The thickness of the first layer of ILD and the resistor thickness combine to match the nominal design thickness of vias in the layer of concern. A second layer of ILD matches the resistor thickness and is planarized to the top surface of the resistor. A third layer of ILD has a thickness equal to the nominal value of the interconnections on this layer. Dual damascene interconnection apertures and apertures for making contact with the resistor are formed simultaneously, with the etch stop upper cap layer in the resistor protecting the resistive layer while the vias in the dual damascene apertures are formed.

16 Claims, 3 Drawing Sheets

US 7,303,972 B2

INTEGRATED THIN-FILM RESISTOR WITH DIRECT CONTACT

TECHNICAL FIELD

The field of the invention is that of forming thin film resistors in the back end of an integrated circuit in a process integrated with the remainder of the back end process.

BACKGROUND OF THE INVENTION

Workers in the field of integrated circuits have long fabricated thin-film resistors in the back end of an integrated circuit. In contrast to resistors located in the silicon substrate of the circuit, which suffer from relatively large parasitic capacitance to the substrate, back end resistors have much less parasitic capacitance, since they are placed vertically above the substrate. Hence, back end of the line (BEOL) resistors are ideal for high frequency RF circuitry applications.

BEOL thin-film resistors are deposited in layers of a material of known resistivity and having a well controlled thickness and therefore inherently have more accurate resistance values than front end resistors that are implanted in the substrate or polysilicon layer and annealed subsequently using rapid thermal annealing processing. The accuracy of the front end resistor is limited due to the inherit variations in thermal temperature control and ion implantation processing.

It is not enough that the resistor is fabricated with the benefits recited above, however. The process of forming the resistor must be integrated into the overall back end process. If the resistor had to be formed using a series of steps that were different from other steps in forming the back end, the cost of forming a resistor would be excessive.

In earlier and current work, e.g. the 180 nm node and above, integration of thin film resistors was straightforward. As the technology advances to the 90 nm node and then to the 65 nm and 45 nm nodes, however, integration will become more difficult because the thickness of the layers in the back end will decrease, making integration progressively more difficult.

The art could benefit from an integrated process for forming a thin-film resistor in the back end of an integrated circuit that is effective for thin layers of interlevel dielectric (ILD) in the back end structure.

SUMMARY OF THE INVENTION

A feature of the invention is the formation of a thin-film resistor in the back end of an integrated circuit in an integrated process in which an interconnect member in the same level as the resistor makes contact with the resistive element of the resistor.

Another feature of the invention is that the metal wire makes direct contact with the resistive element through a dual damascene process during BEOL processing and hence the current carrying capability of resistor is not limited by the contacts.

DETAILED DESCRIPTION

Figure 1:
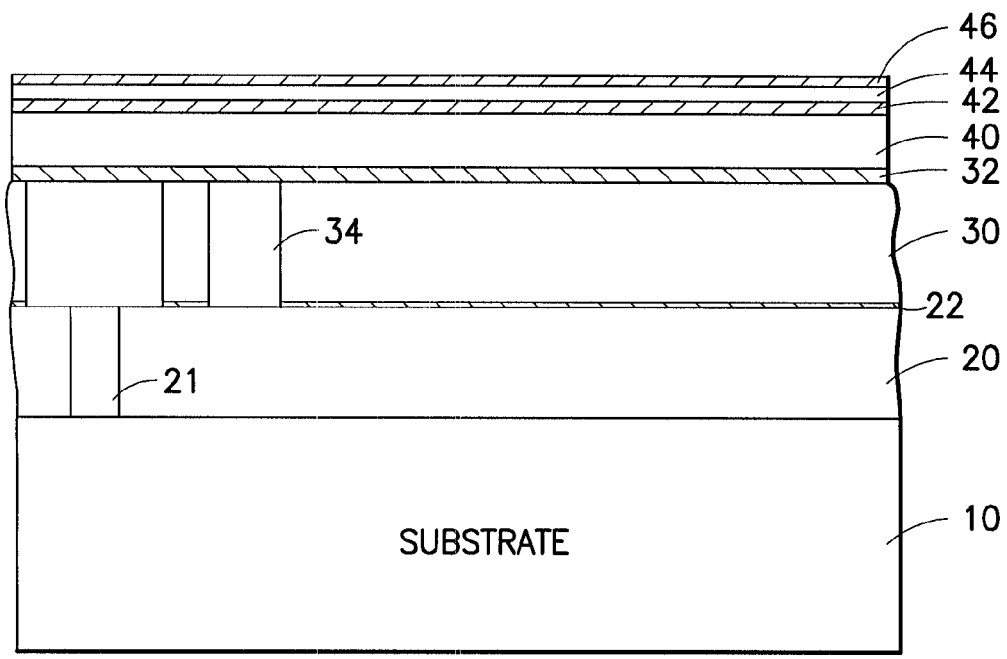
FIG. 1 shows a portion of the back end of an integrated circuit with an unpatterned layer of resistor material.

FIG. 1 shows a portion of the back end of an integrated circuit after a number of preliminary steps including preparing a substrate 10, e.g. silicon; forming transistors in the substrate, and first level interconnects 21 embedded in dielectric 20, illustratively SiO2 (oxide).

A dielectric cap 22, illustratively SiC or Si3N4 (nitride) has been deposited over the first dielectric 20 as an etch stop and/or polish stop. Lower metal interconnections 34 are embedded in dielectric 20. Another cap layer 32 has been deposited on the top surface of lower layer ILD 30.

These illustrations are in the context of a dual-damascene technique for forming back end wiring, in which the interconnections in a layer of the back end are formed in two sub-layers: a lower layer of isolated vias extending down to make contact with lower layers and an upper sub-layer of interconnects extending at some length to make contact with other portions of the circuit. In some cases, as in layer 30, the interconnects may extend through the entire depth of the ILD.

At the top of FIG. 1, a set of resistor layers 42, 44, and 46, together having a resistor thickness, has been deposited on top of a first Inter-Level Dielectric (ILD) 40 by any convenient method such as chemical Vapor Deposition (CVD) or sputtering. Lower cap layer 42 and top cap layer 46, which do not need to be the same material, are illustratively formed of CVD deposited SiCr and layer 44 is formed illustratively of sputtered TaN. Those skilled in the art will be able to substitute other materials having suitable properties.

Figure 2:
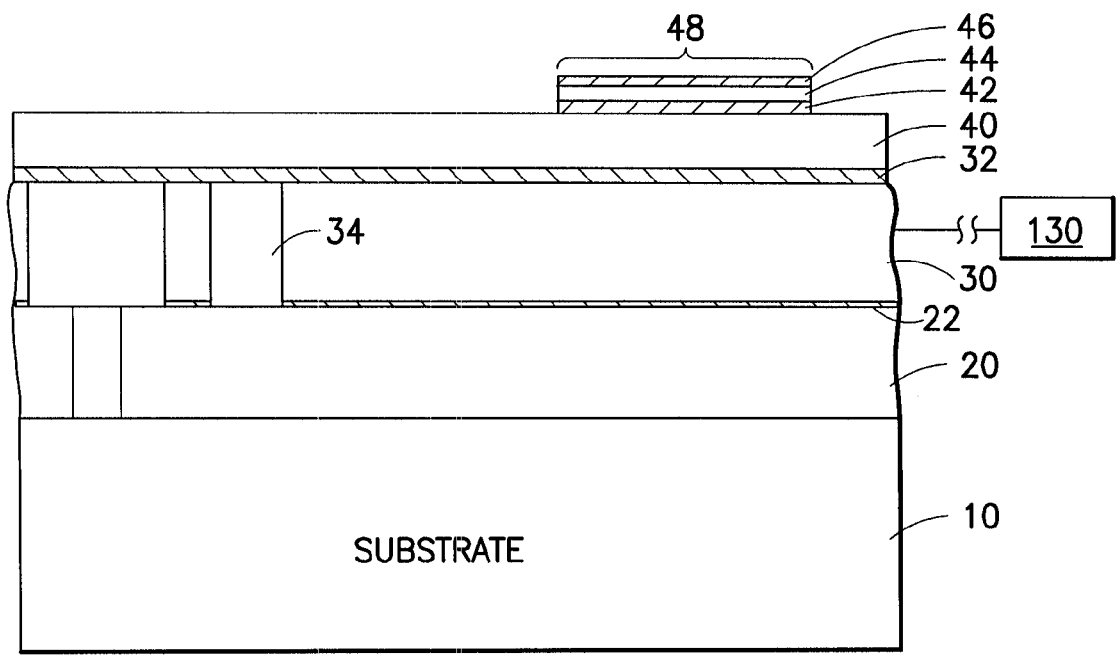
FIG. 2 shows the same region after patterning the resistor to the desired dimension.

FIG. 2 shows the same area after the resistive and cap layers, denoted collectively by bracket 48, have been defined by conventional etching steps to the size and shape required by the circuit designer.

On the right side of FIG. 2, box 130 represents schematically the remainder of the integrated circuit, including other interconnections on the same level as the resistor being fabricated.

Figure 3:
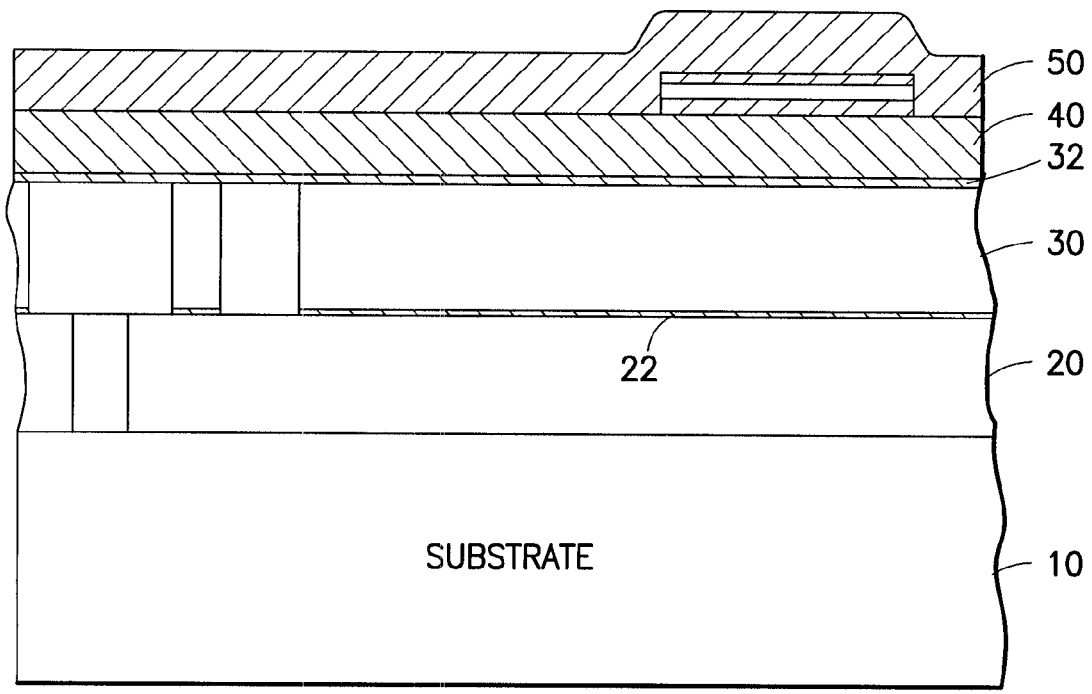
FIG. 3 shows the resistor covered by a first layer of dielectric.

FIG. 3 shows the area after deposition of a (filler) second ILD layer 50 that covers the resistor 48. This layer 50 has a second ILD thickness nominally equal to the resistor thickness and will be planarized by any convenient technique such as chemical-mechanical polishing (CMP) to the top surface of resistor 48.

Figure 4:
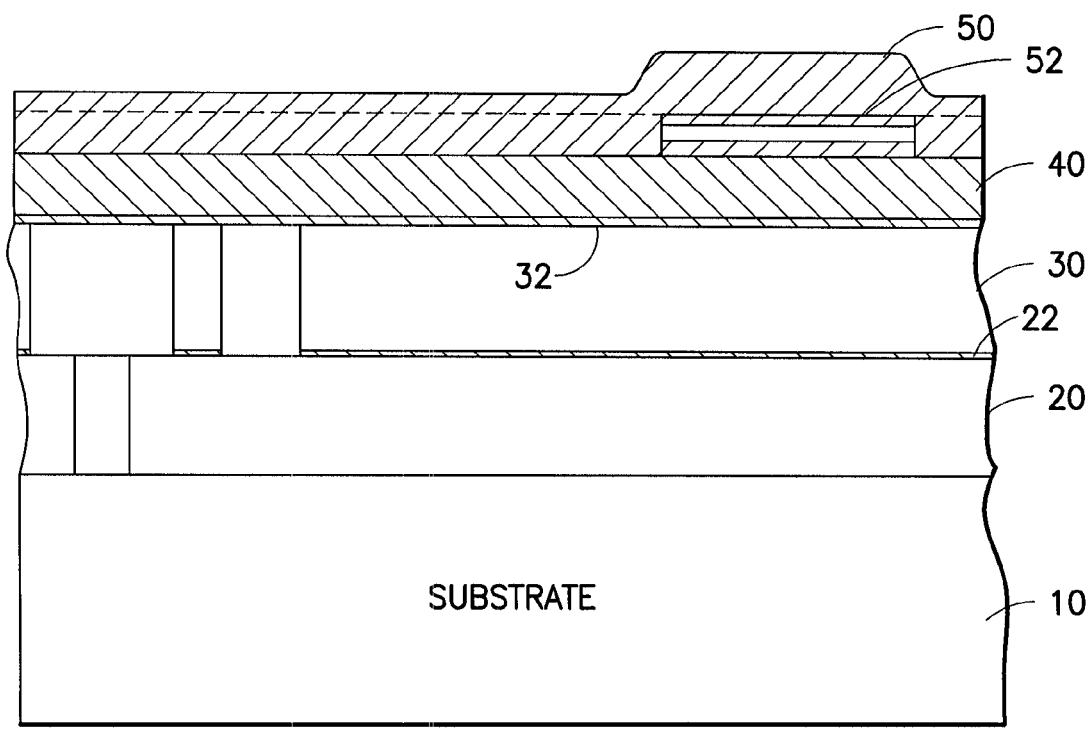
FIG. 4 shows the resistor before chemical-mechanical polishing.

FIG. 4 shows the area after planarization to line 52 at the top surface of resistor 48.

Figure 5:
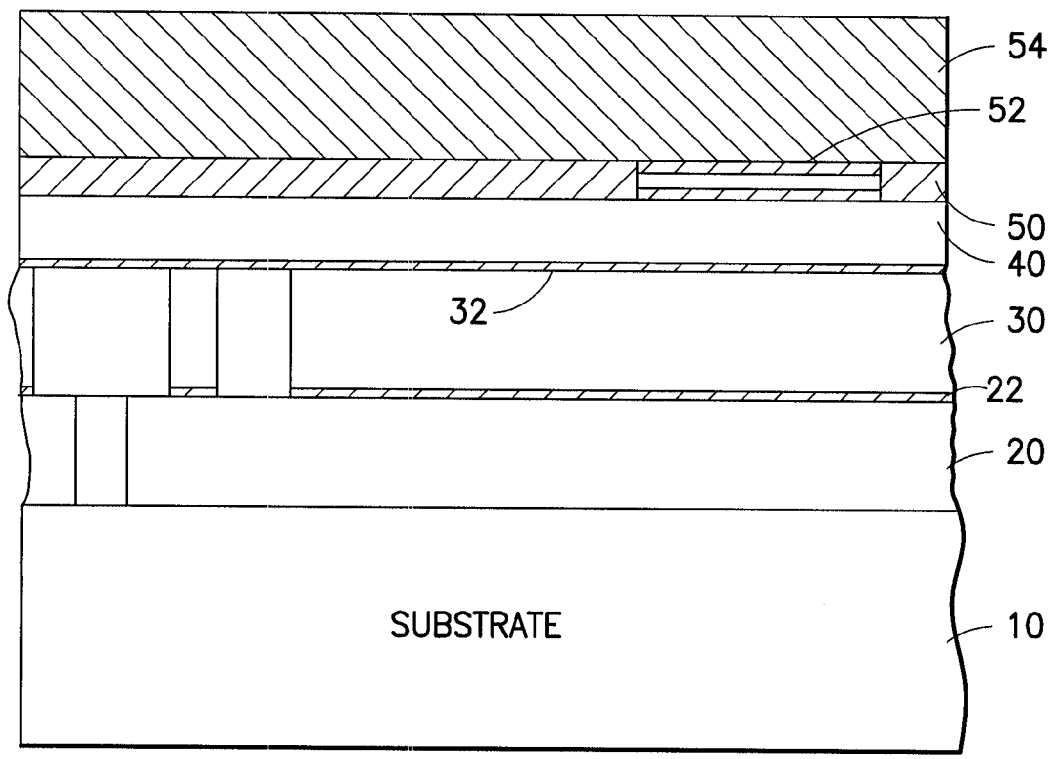
FIG. 5 shows the resistor after polishing and deposition of a second layer of dielectric.

FIG. 5 shows the area after the subsequent deposition of third ILD layer 54. The combined thickness of layers 40 and 50 is chosen to be substantially equal to the depth of a via in this layer. The thickness of layer 54 is chosen to be substantially equal to the thickness of the interconnections on this layer. Those skilled in the art will be aware that the thickness of layers in the back end is not necessarily the same on each level. The thicknesses referred to are those that the circuit designer has chosen for this particular integrated circuit (or for the technology used for this type of integrated circuit).

Figure 6:
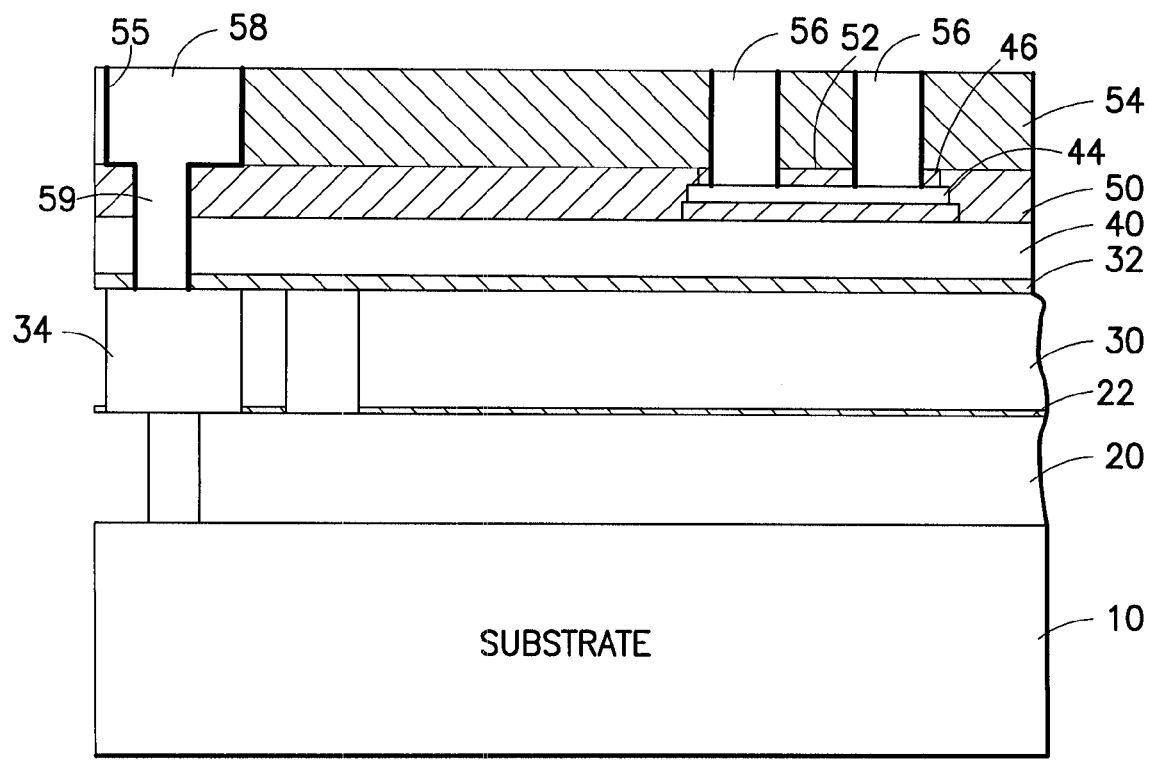
FIG. 6 shows the resistor after formation of contacts.

FIG. 6 shows the area after formation of interconnect apertures in the combined ILD (40, 50 and 54) containing the resistor. On the left of the Figure, dual damascene interconnect 58 has at the bottom via 59 that extends downward to make contact with interconnect 34 of the lower layer. Liner 55 is a conventional liner for preventing diffusion. Illustratively, the conductive material in the interconnects is copper. The sequence of forming the structure shown in this Figure is simultaneously etching metal interconnects 56 and 58, stopping on etch stop (top cap) layer 46. In a later step, a different etch chemistry will be used to etch through layers 32 and 46 simultaneously. Next, vias 59 are etched at the bottom of interconnect 58, stopping on layer 32, while etch stop layer 46 prevents the etch chemistry from penetrating layer 46 to damage layer 44. When the via 59 has reached layer 32 (plus the usual overetch) a different chemistry is used to clean out layers 46 and 32, so that the bottom of via 59 exposes lower interconnect 34 and the bottom of interconnect 56 exposes layer 44. For the purposes of the present invention, it does not matter if vias 59 are etched before interconnects 58 (a via-first method), with the expansion of the upper portion of the via to make interconnects 58 and 56.

Advantageously, the thickness of layers 40 and 50 combine to match the design thickness of via 59. Similarly, the thickness of layer 54 matches the design thickness of interconnect 58. This direct contact between the interconnect and the resistive material 44 is advantageous in that it is more reliable than having a via make the connection to the resistive layer. Interconnnects 56 are shown as being deeper than interconnects 58 because interconnects 56 have the additional step of etching through the cap layer 46.

In a particular example, the material of ILDs 40, 59 and 54 is a combination of fluorinated silicate glass (FSG), hydrogenated oxidized silicon carbon material (SiCOH), and/or organsilicate glass (OSG). The etch used to cut through layer 46 is a conventional silicon nitride or SiC film plasma RIE etch process using fluorine based chemistry.

Preferably, the area in layer 30 under the BEOL resistor in empty in order to avoid coupling from the resistor.

While the invention has been described in terms of a single preferred embodiment, those skilled in the art will recognize that the invention can be practiced in various versions within the spirit and scope of the following claims.

What is claimed is:

1. A method of forming a resistor in the back end of the line of a multi-layer integrated circuit comprising the steps of:
    providing a lower layer having at least one lower metal interconnect and a lower ILD top surface;
    forming a first ILD layer having a first ILD thickness and a first ILD top surface on said lower ILD top surface;
    forming on said first ILD top surface a resistor having a resistor thickness and a resistor top surface and comprising at least a resistive layer and an etch-resistant resistor top cap layer above said resistive layer;
    forming a second ILD layer having a second ILD thickness substantially equal to said resistor thickness;
    planarizing said second ILD layer to said resistor top surface;
    forming a third ILD layer on said second ILD layer;
    simultaneously forming a set of dual-damascene apertures for making contact to at least some of said lower metal interconnects and a set of resistive contact apertures for making contact with said resistor in said third ILD layer;
    etching said set of resistive contact apertures through said resistor cap layer, whereby the bottom of said resistive contact apertures exposes said resistive layer; and
    simultaneously filling said set of dual-damascene apertures and said resistive contact apertures with a conductor.

2. A method according to claim 1, further comprising a step of forming a lower cap layer below said resistive layer, said lower cap layer being adapted to block diffusion of said resistive layer.

3. A method according to claim 1, in which said step of forming said dual-damascene apertures and said resistive contact apertures includes a step of forming vias connecting interconnections in an upper part of said dual damascene apertures with said at least some of said lower metal interconnects while said resistive contact apertures are exposed to an etchant, whereby said resistor top cap layer protects said resistor layer.

4. A method according to claim 2, in which said step of forming said dual-damascene apertures and said resistive contact apertures includes a step of forming vias connecting interconnections in an upper part of said dual damascene apertures with said at least some of said lower metal interconnects while said resistive contact apertures are exposed to an etchant, whereby said resistor top cap layer protects said resistor layer.

5. A method according to claim 1, in which said step of etching said set of resistive contact apertures through said resistor cap layer is performed simultaneously with a step of etching through a lower ILD cap layer on said lower ILD top surface.

6. A method according to claim 2, in which said step of etching said set of resistive contact apertures through said resistor cap layer is performed simultaneously with a step of etching through a lower ILD cap layer on said lower ILD top surface.

7. A method according to claim 3, in which said step of etching said set of resistive contact apertures through said resistor cap layer is performed simultaneously with a step of etching through a lower ILD cap layer on said lower ILD top surface.

8. A method according to claim 1, in which said third ILD layer has a design thickness equal to a design thickness of interconnects in said dual-damascene apertures.

9. A method according to claim 2, in which said third ILD layer has a design thickness equal to a design thickness of interconnects in said dual-damascene apertures.

10. A method according to claim 3, in which said third ILD layer has a design thickness equal to a design thickness of interconnects in said dual-damascene apertures.

11. A method according to claim 1, in which said first ILD thickness and said resistor thickness have a combined design thickness equal to a design thickness of vias in said dual-damascene apertures.

12. A method according to claim 2, in which said first ILD thickness and said resistor thickness have a combined design thickness equal to a design thickness of vias in said dual-damascene apertures.

13. A method according to claim 3, in which said first ILD thickness and said resistor thickness have a combined design thickness equal to a design thickness of vias in said dual-damascene apertures.

14. A method according to claim 8, in which said third ILD layer has a design thickness equal to a design thickness of interconnects in said dual-damascene apertures.

15. A method according to claim 9, in which said third ILD layer has a design thickness equal to a design thickness of interconnects in said dual-damascene apertures.

16. A method according to claim 10, in which said third ILD layer has a design thickness equal to a design thickness of interconnects in said dual-damascene apertures.

* * * * *